United States Patent
Lee et al.

(10) Patent No.: US 7,522,446 B2
(45) Date of Patent: Apr. 21, 2009

(54) HEATING MRAM CELLS TO EASE STATE SWITCHING

(75) Inventors: Heon Lee, Pohang-Si (KR); Thomas C. Anthony, Sunnyvale, CA (US); Manish Sharma, Sunnyvale, CA (US)

(73) Assignee: Samsung Electronics Co., Ltd. (KR)

( * ) Notice: Subject to any disclaimer, the term of this patent is extended or adjusted under 35 U.S.C. 154(b) by 677 days.

(21) Appl. No.: 10/698,501

(22) Filed: Oct. 31, 2003

(65) Prior Publication Data

US 2005/0094456 A1    May 5, 2005

(51) Int. Cl.
*G11C 11/00* (2006.01)
*G11C 7/00* (2006.01)

(52) U.S. Cl. ............... 365/158; 365/171; 365/173
(58) Field of Classification Search ......... 365/158, 365/171, 173
See application file for complete search history.

(56) References Cited

U.S. PATENT DOCUMENTS

| | | | |
|---|---|---|---|
| 5,224,068 A | 6/1993 | Miyake et al. | |
| 5,396,455 A | 3/1995 | Brady et al. | |
| 5,444,651 A | 8/1995 | Yananoto et al. | |
| 5,640,343 A | 6/1997 | Gallagher et al. | |
| 5,761,110 A | 6/1998 | Irrinki et al. | |
| 5,933,365 A | 8/1999 | Klersy et al. | |
| 5,936,882 A | 8/1999 | Dunn | |
| 5,953,245 A | 9/1999 | Nishimura | |
| 5,956,295 A | 9/1999 | Yamakawa et al. | |
| 6,016,290 A | 1/2000 | Chen et al. | |
| 6,603,678 B2 * | 8/2003 | Nickel et al. | 365/171 |
| 6,664,579 B2 * | 12/2003 | Kim et al. | 257/296 |
| 6,667,901 B1 * | 12/2003 | Perner et al. | 365/173 |
| 2002/0089874 A1 | 7/2002 | Nikel et al. | |
| 2003/0123282 A1 | 7/2003 | Nikel et al. | |
| 2003/0198113 A1 | 10/2003 | Abraham et al. | |

FOREIGN PATENT DOCUMENTS

| | | |
|---|---|---|
| JP | 2002-245774 A | 8/2002 |
| JP | 2003-060173 A | 2/2003 |
| JP | 2003-133527 A | 9/2003 |
| JP | 2003-298025 A | 10/2003 |

* cited by examiner

*Primary Examiner*—Son Dinh
(74) *Attorney, Agent, or Firm*—Myers Bigel Sibley & Sajovec

(57) ABSTRACT

A method for making magnetic random access memories (MRAM) which reduces heat conduction from memory cells in an MRAM array. The method uses grid of bit and word lines for selectively accessing data in the array of magnetic memory cells. The grid has a plurality of thermally and electrically resistive portions which provide connections to the magnetic memory cells. The resistive portions increase the thermal resistance for heat generated by each memory cell and during operation provide localized heating of active memory cells to ease cell state switching.

17 Claims, 3 Drawing Sheets

HEATING MRAM CELLS TO EASE STATE SWITCHING

FIELD OF THE PRESENT INVENTION

The present invention relates to magnetic memory device arrays, and more specifically to techniques and circuits for using localized heating of selected cells to ease switching power demands.

BACKGROUND OF THE PRESENT INVENTION

High-density, high-speed, non-volatile, low-power, and low-cost are common goals shared by many memory devices. But all these goals cannot be realistically obtained in practice, and some trade-offs are inevitable. The particular applications dictate which compromises are to be made. For example, static random access memory (SRAM) is fast, but usually comes at the cost of lower density. Such a memory is useful in CPU-cache memory applications. Dynamic random access memory (DRAM) is high density, but is not non-volatile. So DRAM is usually used in main memory applications for general purpose computers.

Newer memory types like magnetic random access memory (MRAM) are inherently non-volatile, but still have to find compromises between density, access speed, etc. Three types of MRAM have been developed based on different magnetic phenomenon, e.g., anisotropic, giant, and tunneling magneto-resistance.

The tunneling magneto-resistance type of MRAM is of interest here. A cross-point array of magnetic tunneling junction (MTJ, sometimes also called spin-dependent tunneling junction, or SDT junction) memory cells allows direct addressing. Each cell appears as a resistance that depends on the digital data value being stored.

The conventional MTJ memory cell comprises two magnetic layers separated by an electrical insulator. The insulator is so thin that it is subject to tunneling currents between the magnetic layers it contacts. Such tunnel currents appear as an electrical resistance that depends on the relative orientation of the magnetizations of the two magnetic layers. The upper and lower magnetic layers are deposited as ellipsoids so that their magnetizations will occur in one of two preferred directions, e.g., longitudinal with the ellipsoid. Other shapes, such as rectangular or asymmetric, and of appropriate aspect ratios (ie, length-to-width ratios) may also be used.

The lower magnetic layer is fabricated with a high coercivity material and is permanently magnetized in a set direction during an annealing process step. This layer serves as the reference layer. The upper magnetic layer comprises a lower coercivity material whose magnetization direction is switched by column and row data-write currents that produce write fields that combine at the targeted cross-point array intersection. This layer serves as the data or storage layer (sometimes also called the bit layer or the sense layer). In other versions, the data and the reference layers may be deposited in the opposite order. In a version of the memory cell called the "spin-valve", the reference layer is "pinned" by exchange coupling by an adjacent antiferromagnetic layer. In such a spin-valve, the orientation of the magnetization of the pinned reference layer remains substantially fixed.

The electrical resistance through the tunnel barrier is dependent on the relative orientations of the magnetizations in the data and reference layers. When these magnetizations are oriented in the same direction, the electrical resistance will have a certain value and when the magnetizations oppose each other the resistance will be changed. This change in resistance is the tunneling magneto-resistance (TMR) effect and the state of the data layer can be read by measuring the apparent electric resistance across the layers. Typically, the MTJ resistance is low when the magnetization orientations are parallel, and high when antiparallel.

As cells become smaller, thermal stability issues become more important. The coercivity, or magnetic switching field, of small magnetic memory cells must be large enough to ensure that stored information is not lost because of random switching induced by environmental influences. The coercivity required to produce a thermally stable memory cell increases as the memory cell is made smaller. Unfortunately, the necessity to generate the larger field strength makes switching of the smaller memory cells during the write operation more difficult.

It is known that increasing the temperature of the memory cell lowers the magnetic field strength that is required for switching. This is because the magnetic material now has a higher thermal energy at this increased temperature. Further, when an electrical current passes through the memory cells, heat is developed in the cells. However, the developed heat is easily conducted through the bit and word lines away from the memory cell and therefore cannot be utilized to facilitate switching of the magnetic memory cell.

There is therefore a need for a magnetic memory device in which loss of heat from the magnetic memory cell is reduced and therefore the heat can be utilized to ease cell state switching.

SUMMARY OF THE INVENTION

Briefly, a magnetic random access memory (MRAM) embodiment of the present invention comprises an array of magnetic memory cells that store data as different values of impedance. The MRAM also comprises a grid of bit and word lines for selectively accessing data in the array of magnetic memory cells. The grid has a plurality of thermally and electrically resistive portions which provide connections to the magnetic memory cells. The resistive portions increase the thermal resistance for heat generated by each memory cell and during operation provide localized heating of active memory cells to ease cell state switching.

The invention will be more fully understood from the following description of embodiments of the invention. The description is provided with reference to the accompanying drawings.

DETAILED DESCRIPTION OF EMBODIMENTS

Figure 1A:
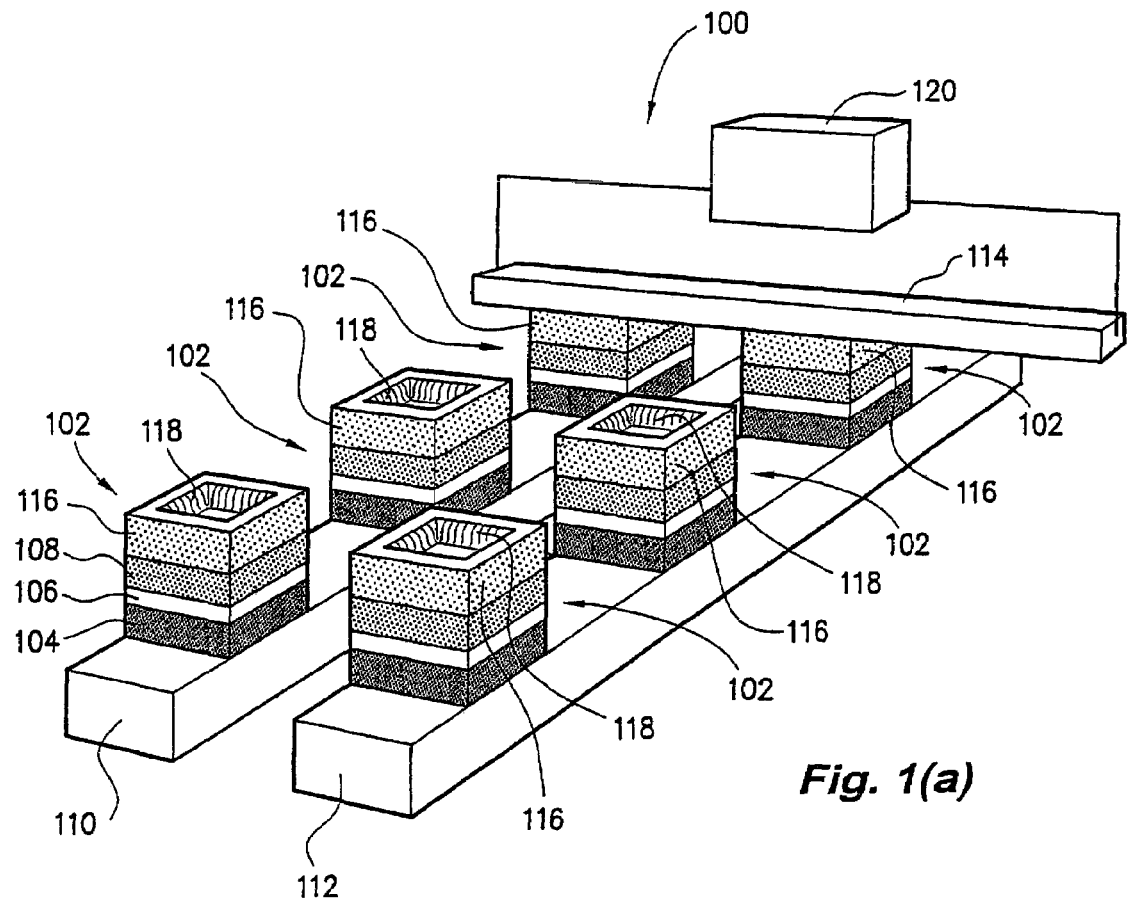
FIG. 1A is a perspective diagram of a magnetic memory device according to a first embodiment in which spacers are above the MRAM cells.
Figure 1B:
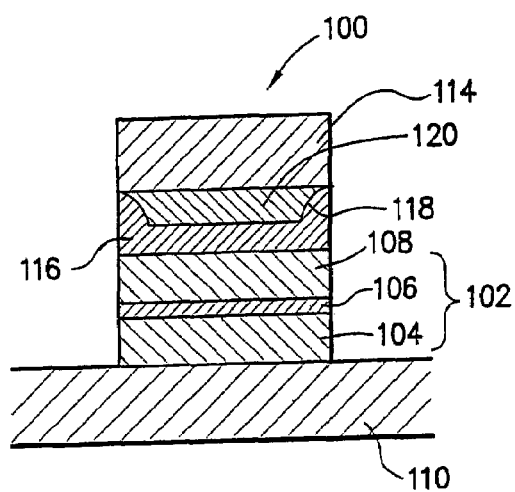
FIG. 1B is a schematic cross-sectional diagram of a magnetic memory device according to the first embodiment of the present invention.

FIGS. 1A and 1B represent a magnetic random access memory (MRAM) array embodiment of the present invention, and is referred to herein by the general reference numeral 100. The MRAM 100 includes an array of magnetic memory cells 102. Such are based on tunneling magneto-resistance (TMR) technology, the tunneling current across a dielectric tunnel barrier is influenced by the relative orientation of two adjacent magnetic layers. Each memory cell 102 comprises a magnetic reference layer 104, a dielectric layer 106, and a magnetic data layer 108. The device further comprises conductive word lines 110, 112, and bit lines, as represented by bit line 114. For clarity only one bit line is shown.

A magnetic field surrounds the bit line 114 when a data-write current is applied to the bit line 114. Such magnetic field can be used to switch magnetic memory cells 102, e.g., by flipping the permanent-magnet data layer 108 to the opposite polarization. Binary information can therefore be stored as a function of the direction of the magnetic field generated by the current applied to bit line 110.

In this embodiment, spacers 116 are disposed in a cross-point grid between respective magnetic memory cells 102 and bit lines 114. The spacers 116 include a conductive material and have a recess 118. The recess is filled with a thermally insulating material 120, such as $SiO_2$. The spacers 116 establish a heat barrier because the conductive material has a relatively small cross-sectional area and therefore the cross-sectional area though which heat can be conducted is relatively small. Consequently more of the heat generated by the memory cell will linger, and the extra heat will ease switching of the magnetic memory cell 102. The reduced cross-sectional area of the spacer at the recess also increases the electrical resistance of the spacer and causes it to work as a electro-resistive heater. Such added localized heat further eases switching of the magnetic memory cells.

FIG. 1A schematically shows a circuit unit 120 that, in use, generates a write current through the bit line 114. The circuit may also generate a write current through the word lines 110 and 112. For clarity, electrical connections to the circuit unit 120 are not shown for word lines 110 and 112. Each magnetic memory cell may comprise a number of additional layers, which are not shown for clarity.

Dielectric layer 106 is thin enough so that, when a suitable electrical potential is applied between word line 110 or 112 and bit line 114, a tunneling current will flow through the dielectric layer 106. The tunneling probability and therefore the impedance of the memory cell depends on the direction of the magnetization in the data layer 108 relative to that of the reference layer 104. Therefore, it is possible to determine the orientation of the magnetization in the data layer from the tunneling current which is dependent on the resistance of the memory cell 102.

The spacers 116 are resistive and are, in this embodiment, composed of TaN or a silicide. In general, possible materials also include amorphous materials, such as amorphous silicon or amorphous carbon, owing to the higher thermal resistivity of the amorphous state. Each spacer 116 has an etched recess that is surrounded by a coupling surface which is coupled to a bit line such as line 114. The spacers 116 may directly contact the bit lines. Alternatively, the spacers do not directly contact the bit lines and layers of further material may separate the spacers and the bit lines.

The word lines 110 and 112 may also operate as bit lines. Further, it will be appreciated that each magnetic memory cell may comprise a number of additional layers such as capping, anti-ferromagnetic pinning (AF) and seed layers. Further, it will be appreciated that in variations of this embodiment the spacers may be positioned below or above the memory cells and the reference layers (or data layers) can be either in the upper portion or in the lower portion of each memory cell.

In a specific example of this embodiment, the spacers 116 have a height of approximately 100 nm and a base area of approximately 150×150 nm. Each coupling surface area that surrounds a respective recess has approximately 10% to 20% the area of the base surface area. While the recess 118 in FIG. 1B is shown extending through a portion of spacer 116, in other embodiments the recess can extend through the entire thickness of the spacer.

In this particular example, the data layer 108 is composed of nickel iron (NiFe), the reference layer 104 is composed of cobalt iron (CoFe) and the dielectric layer 106 is composed of $Al_2O_3$. These layers have the same planar area of approximately 150 nm×150 nm, and the reference layer 104, the data layer 108 and the dielectric layer 106 have a thickness of approximately 3.5 nm, 3 nm, and 1.2 nm respectively. In this example, the spacers 116 have the same planar base surface area as the magnetic memory cells 102. Alternatively the spacers may have a base surface area that is smaller or larger than that of the magnetic memory cells 102. Further, the spacers 116 may not be centered on the magnetic memory cells 102.

The spacers 116 may be fabricated as follows. Initially magnetic memory cells 102 are fabricated by known deposition and etching processing steps. A layer of conductive material such as doped amorphous silicon is deposited to a thickness of approximately 100 nm over the magnetic memory layers prior to patterning. The conductive spacer material is patterned when etching the memory cells, resulting in spacer 116 having the same dimensions as memory cells 102. The memory cells and area between the magnetic memory cells are coated with a dielectric material such as $SiO_2$ and planarized by chemical-mechanical polishing (CMP). A positive resist photolithography process is used to define the location and size of the recesses of each spacer. This is followed by an isotropic etch process that forms the recessed core of the spacers. As the etch process is isotropic, it is possible to form recesses so that the electrically conductive portion of each spacer has a cross-section that is substantially U-shaped, with the thickness of the legs decreasing towards the end of the legs. This process makes it possible to fabricate coupling surfaces that have dimensions that are below the lithographic limit. The recesses are then filled with a thermally insulating material such as $SiO_2$ and the structure is then chemical-mechanically polished for a second time to yield a flat surface with the surface area of the spacer that surrounds the recesses being exposed. In this way the core of the spacer is a thermally insulating material and the perimeter of the spacer is an electrically conducting material.

It is possible to achieve a spacer with a narrow conductive ring with somewhat tapered walls this way. Filling up the middle with the thermal insulator is also possible. The material surrounding the memory cell is an insulating dielectric that almost always is also thermally insulating, so the spacer ring will be surrounded on both sides by thermal insulation.

FIG. 1A includes a data-write generator 120 that outputs a data-write current through bit line 114. The circuit may also generate a current through word lines 110 and 112. Electrical connections to the data-write generator 120 are not shown for word lines 110 and 112.

Although not illustrated in FIG. 1A, MRAM 100 typically includes a read circuit for sensing the resistance of selected memory cells 102. During read operation, a constant voltage is applied to the bit line 114 and sensed by the read circuit. An external circuit may provide the constant supply voltage.

The reverse of such structure an also be used. An insulating spacer ring can be used around a conducting tapered or straight core in the middle. Such process is referred to as a "DRAM spacer" process, and is used in the fabrication of DRAM's to produce a sharp vertical spacer at the edges of the gates of a CMOS transistor. Such improve the performance of the CMOS transistor significantly by specifically reducing the gate-to-source, and gate-to-drain parasitic capacitances.

Figure 2:
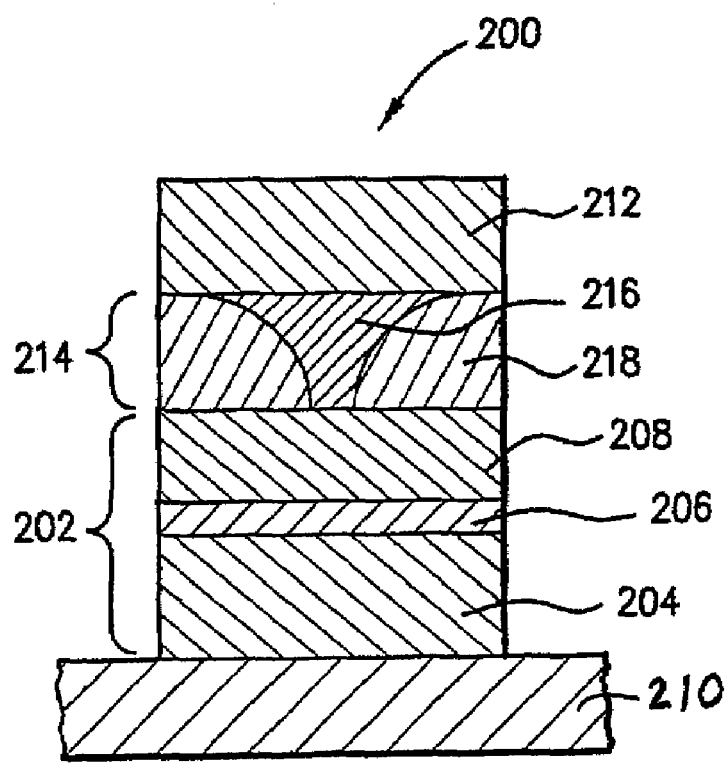
FIG. 2 is a schematic cross-sectional diagram of a magnetic memory device according to a second embodiment in which spacers are below MRAM cells.

FIG. 2 shows a portion of the device 200 comprising magnetic memory cells 202. Each magnetic memory cell comprises a reference layer 204, a dielectric layer 206 and a data layer 208. The structure and composition of the magnetic memory cells 202 is analogous to that of magnetic memory cells 102 shown in FIG. 1 and discussed above. The magnetic memory cell 202 is disposed between word line 210 and bit line 212. However, in a variation of this embodiment word line 210 may also operate as a word line and the bit line 212 may also operate as a bit line. Further, the spacers 214 may also be positioned below the MRAM cells 202.

In this embodiment the spacers 214 have a narrow conductive core 216 and an insulating sleeve 218 surrounds the narrow conductive core 216. The narrow conductive core 216 has a cross-section smaller than that of the MRAM cells increases the thermal resistance for heat generated by each memory cell. Further, the relatively narrow conducting core of each spacer 214 provides localized heating of active memory cells to ease cell state switching.

The conductive material of the spacers is, in this embodiment, TaN or a silicide. In general, possible materials also include electrically conductive amorphous materials, such as amorphous silicon or amorphous carbon, owing to the higher thermal resistivity of the amorphous state.

The spacers 116 and 214 may not be in direct contact with the bit lines. For example, layers of further material may be disposed between the spacers 116 and the bit lines. The spacers 214 have a height of approximately 100 nm and a base area of approximately 150×150 nm. Such spacers may be fabricated as follows.

Initially magnetic memory cells 202 are fabricated by known deposition and etching processing steps. A first layer of insulating material such as $SiO_2$ is deposited to a thickness of approximately 100 nm over the magnetic memory layers prior to patterning. The first insulating material is patterned when etching the memory cells, resulting in spacer 214 having the same dimensions as memory cells 202. The area between and over the magnetic memory cells is filled with a second insulating material such as $Si_3N_4$ and then planarized by CMP. A positive resist photolithography process is used to define the location and size of a via to be etched in the first insulating layer. This is followed by an anisotropic etch process that creates the via, or hollow space, in the first insulating material over the MRAM cells. A third layer of the insulating material is deposited on the structure to line the walls and the floor of each hollow portion over the MRAM cells. An anisotropic dry-etch process is then used to selectively etch through the floor of the insulating lining to expose the top layer of the MRAM cells. The deposition and etch of the third insulating layer can reduce the diameter of the via below the lithographic limit. The hollow portions are then filled with a conductive material and planarized by CMP so that spacers are formed that comprise a conductive core surrounded by insulating walls along the perimeter. Possible materials for the conductive core include TaN, a silicide or electrically conductive amorphous materials, such as amorphous silicon or amorphous carbon, owing to the higher thermal resistivity of the amorphous state.

The spacers 214 directly contact the bit lines. Alternatively, layers of further material may be disposed between the spacers 214 and the bit lines.

Figure 3:
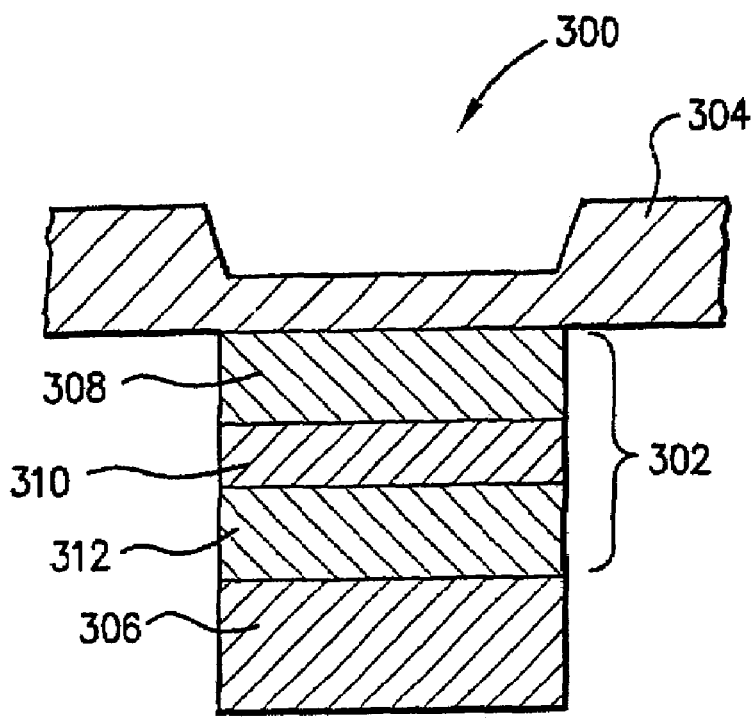
FIG. 3 is a schematic cross-sectional diagram of a magnetic memory device according to a third embodiment in which bit or word lines have portions of reduced thickness.

FIG. 3 shows a third embodiment of the MRAM device. The device 300 comprises identical components as device 100 shown in FIGS. 1(a) and (b) and described above, however, in this embodiment the word or bit lines have portions of reduced thickness which contact the MRAM cells. FIG. 3 shows an MRAM cell 302 and lines 304 and 306 contact the MRAM cell 302. Each MRAM cell comprises a data layer 308, dielectric layer 310 and reference layer 312. The structure and composition of the magnetic memory cells 302 is analogous to that of magnetic memory cells 102 shown in FIG. 1 and discussed above.

Each magnetic memory cell may comprise a number of additional layers such as capping, AF and seed layers which are not shown for clarity. Further, in a variation of this embodiment, bit line 304 may function as word line and word line 306 may function as bit line. Bit line 304 may be disposed below the MRAM cell 302 and word line 306 may be disposed above the MRAM cell 302.

The reduced thickness of bit line 304 causes an increase of the thermal and electrical resistances, which reduces loss of heat generated in an active MRAM cell 302. Further, due to the increased electrical resistance the portion of reduced thickness will generate resistive heat, which further eases cell state switching. In this embodiment, the bit line 304 may comprise a composite material. For example, the portions of reduced thickness may be composed of TaN or a silicide or another resistive material. Linkage portions that link the portions of reduced thickness, may be composed of copper or another material of high conductivity. In this case the choice of material for the resistive portions further increases the local thermal and electrical resistance of the portions of reduced thickness.

Figure 4A:
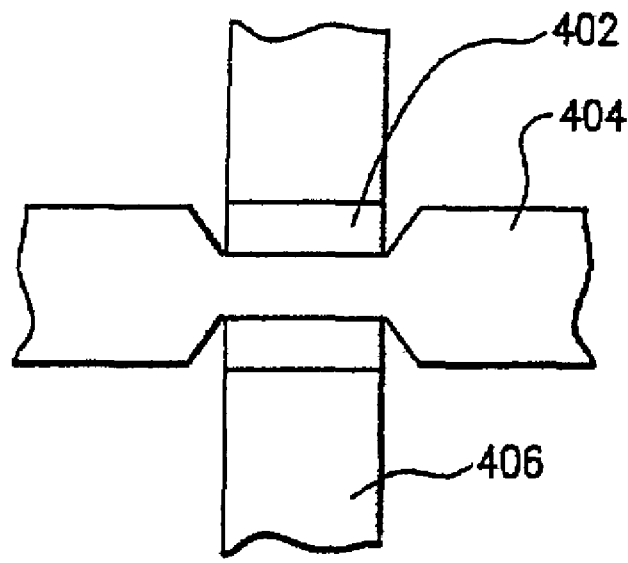
FIG. 4A is a schematic top view and FIG. 4B is a schematic cross-sectional diagram of a magnetic memory device according to a fourth embodiment in which bit or word lines have portions of reduced width.
Figure 4B:
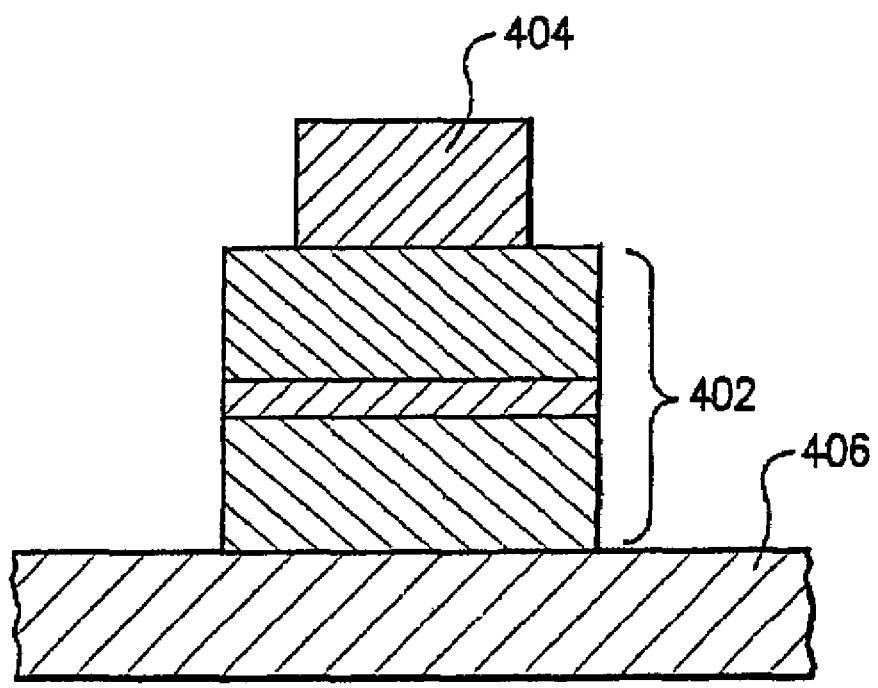

FIG. 4A and FIG. 4B show a fourth embodiment of the MRAM device. Again, the device 400 comprises identical components as device 100 shown in FIGS. 1(a) and (b) and described above, however, in this embodiment the word or bit line have portions of reduced width which contact the MRAM cells. The FIG. 4A and FIG. 4B show an MRAM cell 402 contacted by bit line 404 and word line 406. The structure and composition of the magnetic memory cells 402 is analogous to that of magnetic memory cells 302 shown in FIG. 3 and discussed above. The MRAM cell 402 comprises a number of additional layers such as capping, AF and seed layers which are not shown for clarity. Further, in a variation of this embodiment bit line 404 may function as word line and word line 406 may function as bit line. Bit line 404 may also be disposed below the MRAM cell 402 and word line 406 may be disposed above the MRAM cell 402.

The reduced width of bit line 404 causes an increase of the thermal and electrical resistances, which reduces loss of heat generated in an active MRAM cell 402. Further, due to the increased electrical resistance the portion of reduced width will generate resistive heat, which further eases cell state switching. As in the embodiment shown in FIG. 3 and discussed above, the portions of reduced width may be composed of TaN or a silicide, which further increases the local thermal and electrical resistance of the portions of reduced width.

In the third and fourth embodiment the bit and word lines are composed of a conductor, such as copper, and fabricated using standard procedures. The resistive portions are shaped using a sequence of deposition and etch processing steps.

Although the invention has been described with reference to particular examples, it will be appreciated by those skilled in the art that the invention may be embodied in many other forms. For example, the magnetic memory cells may be colossal magneto-resistance memory cells (CMR) or giant magneto-resistance memory (GMR) cells. The devices 100 and 200 may comprise an array having any number of memory cells arranged in any number of rows and columns. Further, it will be appreciated that the spacers may be coupled to the magnetic memory cells not only from above, as shown in FIGS. 1(*a*) and (*b*), or from below, as shown in FIG. 2, but from above and below. In addition, the spacers may have more than one recess.

Further, it will be appreciated that the MRAM device may have features that may be a combination of the features shown in FIG. 1 to 4. For example, the MRAM device may have spacers and in addition the bit or word lines may have portions of reduced cross-sectional area which increase the thermal and/or the electrical resistance.

What is claimed is:

1. A magnetic random access memory (MRAM) device, comprising:
   an array of magnetic memory cells that store data as different values of impedance;
   a grid of bit and word lines for selectively accessing data in the array of magnetic memory cells; and
   a plurality of corresponding resistors each placed in series with ones of the magnetic memory cells and the bit and word lines each of the plurality of corresponding resistors having a cross-section smaller than that of the magnetic memory cells;
   wherein, the corresponding resistors cause localized heating of selected ones of the magnetic memory cells that assists in their switching.

2. The MRAM of claim 1 wherein:
   the plurality of corresponding resistors are such that the thermal conduction path is modified to reduce heatsinking of the selected ones of the magnetic memory cells into the grid of bit and word lines.

3. The MRAM of claim 1 wherein:
   the plurality of corresponding resistors are such that the electrical conductivity is modified to cause electro-resistive heating of the selected ones of the magnetic memory cells.

4. The MRAM of claim 1 wherein:
   the plurality of corresponding resistors are such that the electrical conductivity is modified to cause electro-resistive heating of the selected ones of the magnetic memory cells, each spacer having a connection face that has a perimeter portion that is electrically conductive and a core portion that is thermally insulating so as to form barriers for heat conduction from the memory cells thereby easing cell state switching.

5. The MRAM as claimed in claim 4 wherein the conductive perimeter portion has a cross-sectional area smaller than that of the memory cell.

6. The MRAM of claim 3 wherein:
   the electrically conducting perimeter portion is created by an isotropic etch process that removes electrically conductive material from a core portion of the spacer.

7. The MRAM of claim 6 wherein:
   the electrically conducting perimeter portion comprises a narrow ridge of conductive material through which electrical connection to the memory cell is established.

8. The MRAM of claim 1, wherein:
   the plurality of corresponding resistors comprise a plurality of spacers, each spacer connecting a line with a respective one of said magnetic memory cells, each spacer having a connection face that has a perimeter portion that is electrically conductive so as to form barriers for heat conduction from the memory cells thereby easing cell state switching.

9. The MRAM in claim 8 wherein the conductive core portion has a cross-sectional area smaller than that of the memory cell.

10. The MRAM in claim 8 wherein:
    The electrically conductive core portion is formed by etching a hole into an insulating material using an isotropic etch process and filling the hole with an electrically conductive material through which connection to the memory cells is established.

11. The MRAM of claim 1, wherein:
    the plurality of corresponding resistors comprise a plurality of spacers, each spacer connecting a line with a respective one of said magnetic memory cells, each spacer having a connection face that uses a thermally insulating material so as to form barriers for heat conduction from the memory cells thereby easing cell state switching.

12. The MRAM of claim 1, wherein:
    the corresponding resistors are formed as areas of reduced cross-section of the lines in the grid.

13. The MRAM of claim 12 wherein:
    the reduced cross-sectional area is created by reducing the thickness of one or more conductor lines in the region adjacent one or more magnetic memory cells.

14. The MRAM of claim 12 wherein:
    the reduced cross-sectional area is created by narrowing the width of one or more conductor lines in the region adjacent one or more magnetic memory cells.

15. A magnetic random access memory (MRAM) device, comprising:
    an array of magnetic memory cells that store data as different values of impedance;
    a grid of bit arid word lines for selectively accessing data in the array of magnetic memory cells; and
    a plurality of spacers, each spacer connecting a line with a respective one of said magnetic memory cells, each spacer having a connection face that has a recess which is filled with an electrically insulating material to increase the electrical resistance of the spacers to generate heat when a current passes through the spacers which can be utilized to ease cell state switching.

16. A magnetic random access memory (MRAM) device, comprising:
    an array of magnetic memory cells that store data as different values of impedance;
    a grid of bit and word lines for selectively accessing data in the array of magnetic memory cell, the grid having a plurality of thermally and electrically resistive portions which provide connections to the magnetic memory cells each of the plurality of thermally and electrically resistive portions having a cross-section smaller than that of the magnetic memory cells; and
    wherein the resistive portions increase the thermal resistance for heat generated by each memory cell and during operation provide localized heating of active memory cells to ease cell state switching.

17. A method for operating MRAM devices, comprising:
    conducting an electrical current through narrow portions of a spacer that connects memory cells of an MRAM array with bit and word lines so that heat is resistively generated in the narrow portions wherein the spacer has a cross-section smaller than that of the memory cells; and
    using the generated heat to ease cell state switching of memory cells.

\* \* \* \* \*

UNITED STATES PATENT AND TRADEMARK OFFICE
CERTIFICATE OF CORRECTION

PATENT NO. : 7,522,446 B2  Page 1 of 1
APPLICATION NO. : 10/698501
DATED : April 21, 2009
INVENTOR(S) : Lee et al.

It is certified that error appears in the above-identified patent and that said Letters Patent is hereby corrected as shown below:

On the Title Page:
Item 56, Other Publications: Please insert the following:
-- Hewlett-Packard published application number 20020089874, serial 758757, filed 1/11/01, Thermally-assisted switching of magnetic memory elements, Nikel, et al. --

-- Hewlett-Packard published patent application number 20030123282, serial 315748, filed 12/10/02, Thermally-assisted switching of magnetic memory elements, Nikel, et al. --

-- Ryan, Mason & Lewis, LLP published patent application 20030198113, serial 128838, filed 4/23/02, Memory storage device with heating element, Abraham, David W.; et al.--

In the Claims:
Column 8, Claim 15, Line 35: Please correct "arid" to read -- and --

Signed and Sealed this

Second Day of June, 2009

JOHN DOLL
*Acting Director of the United States Patent and Trademark Office*